(12) United States Patent
Toriyama et al.

(10) Patent No.: US 9,831,290 B2
(45) Date of Patent: Nov. 28, 2017

(54) SEMICONDUCTOR MEMORY DEVICE HAVING LOCAL BIT LINE WITH INSULATION LAYER FORMED THEREIN

(71) Applicant: Toshiba Memory Corporation, Minato-ku (JP)

(72) Inventors: Shuichi Toriyama, Yokohama (JP); Kenichi Murooka, San Jose, CA (US); Shintaro Nakano, Kawasaki (JP); Tatsuya Ohguro, Yokohama (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/066,410

(22) Filed: Mar. 10, 2016

(65) Prior Publication Data

US 2017/0263681 A1   Sep. 14, 2017

(51) Int. Cl.
*H01L 29/02* (2006.01)
*H01L 27/24* (2006.01)
*H01L 45/00* (2006.01)

(52) U.S. Cl.
CPC ............ *H01L 27/249* (2013.01); *H01L 45/06* (2013.01); *H01L 45/08* (2013.01); *H01L 45/085* (2013.01); *H01L 45/1226* (2013.01); *H01L 45/1253* (2013.01); *H01L 45/141* (2013.01); *H01L 45/146* (2013.01)

(58) Field of Classification Search
CPC ......... H01L 45/04; H01L 29/00; H01L 27/24; G11C 13/0004
USPC .................. 257/1–5, E29.002; 438/102–104
See application file for complete search history.

(56) References Cited

U.S. PATENT DOCUMENTS

| | | | |
|---|---|---|---|
| 2004/0061153 A1* | 4/2004 | Misewich | G11C 11/22 257/295 |
| 2007/0012356 A1* | 1/2007 | Nanu | H01G 9/20 136/264 |
| 2008/0280390 A1* | 11/2008 | Kim | H01L 27/2409 438/95 |
| 2009/0230512 A1* | 9/2009 | Baek | H01L 27/249 257/536 |
| 2010/0219392 A1* | 9/2010 | Awaya | H01L 27/2454 257/3 |
| 2012/0104351 A1* | 5/2012 | Wei | H01L 27/2409 257/4 |

(Continued)

OTHER PUBLICATIONS

Youn Hee Kang, et al., "Observation of conductive filaments in a resistive switching nonvolatile memory device based on amorphous InGaZnO thin films", Materials Chemistry and Physics, vol. 138, 2013, pp. 623-627.

*Primary Examiner* — Jami M Valentine
(74) *Attorney, Agent, or Firm* — Oblon, McClelland, Maier & Neustadt, L.L.P.

(57) ABSTRACT

According to one embodiment, a semiconductor memory device includes first conductive layers extending in a first direction and stacked in a second direction intersecting the first direction, a first semiconductor layer extending in the second direction and including a material having one of a first conductivity type and a second conductivity type, a first insulation layer disposed inside the first semiconductor layer, a second conductive layer disposed inside the first insulation layer, and a variable resistance layer disposed between the first conductive layers and the first semiconductor layer.

12 Claims, 7 Drawing Sheets

(56) References Cited

U.S. PATENT DOCUMENTS

2016/0064663 A1* 3/2016 Masuoka ............... H01L 45/06
257/4

* cited by examiner

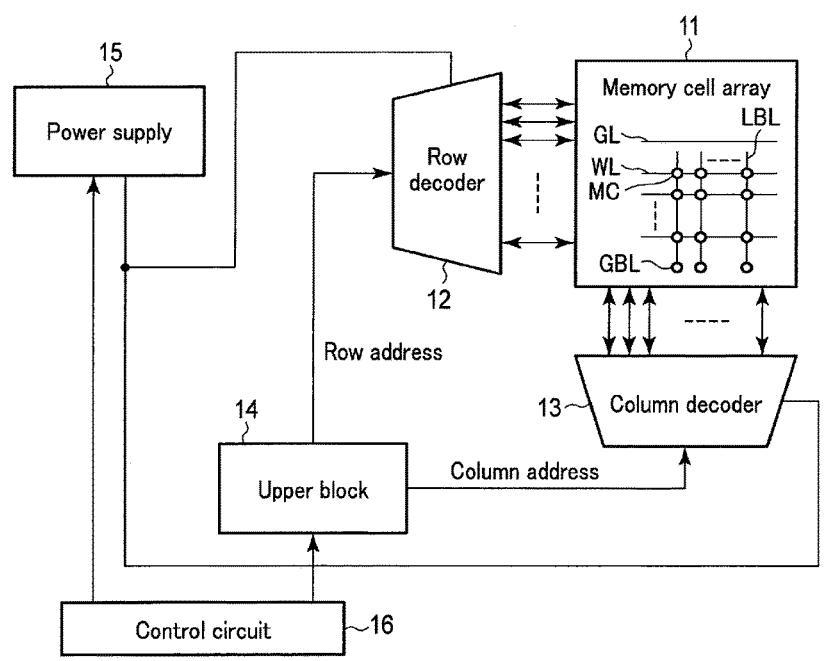
F I G. 1

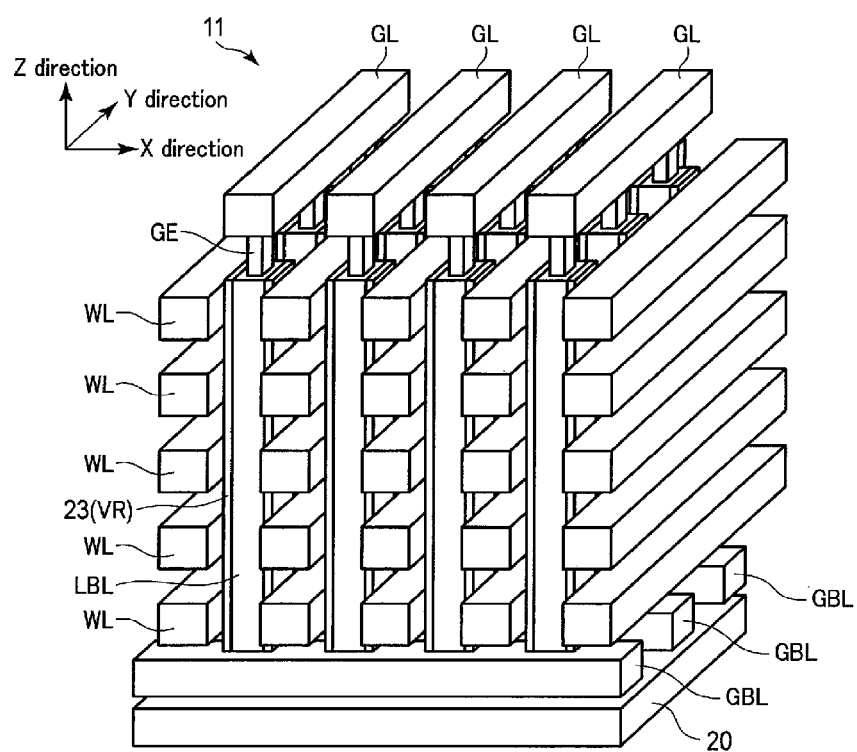
F I G. 3

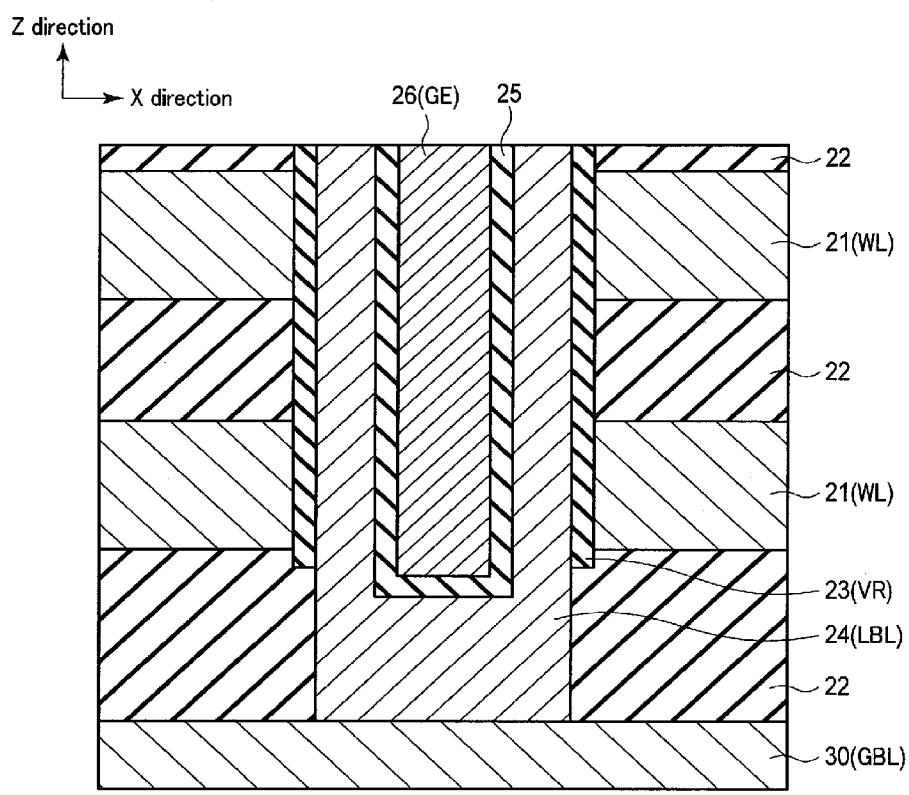
F I G. 5

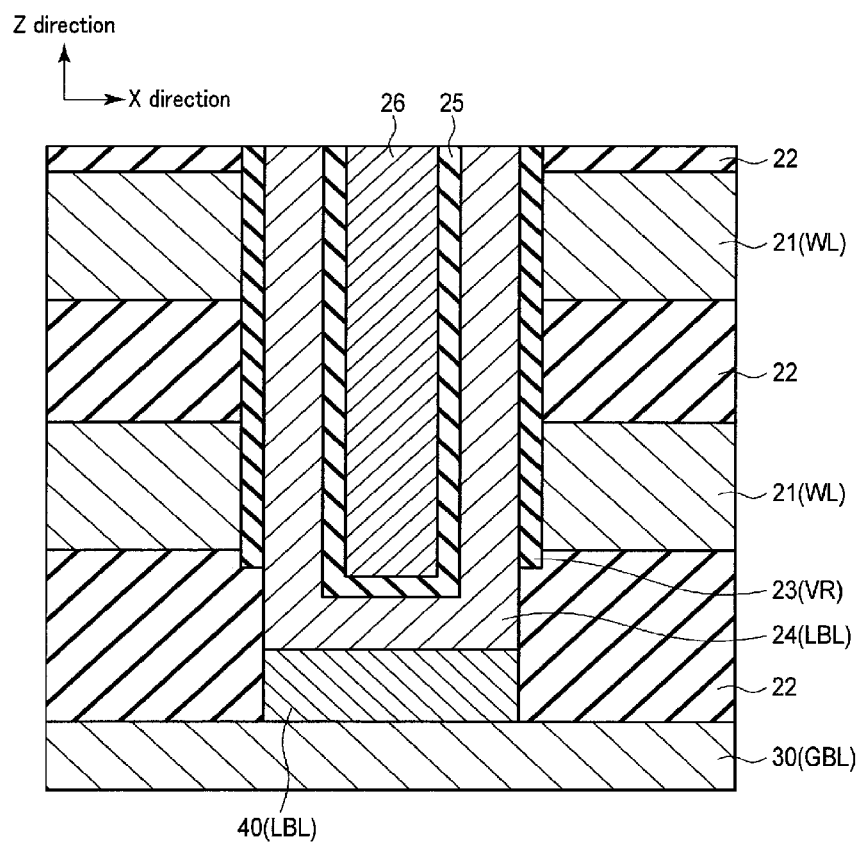
F I G. 6

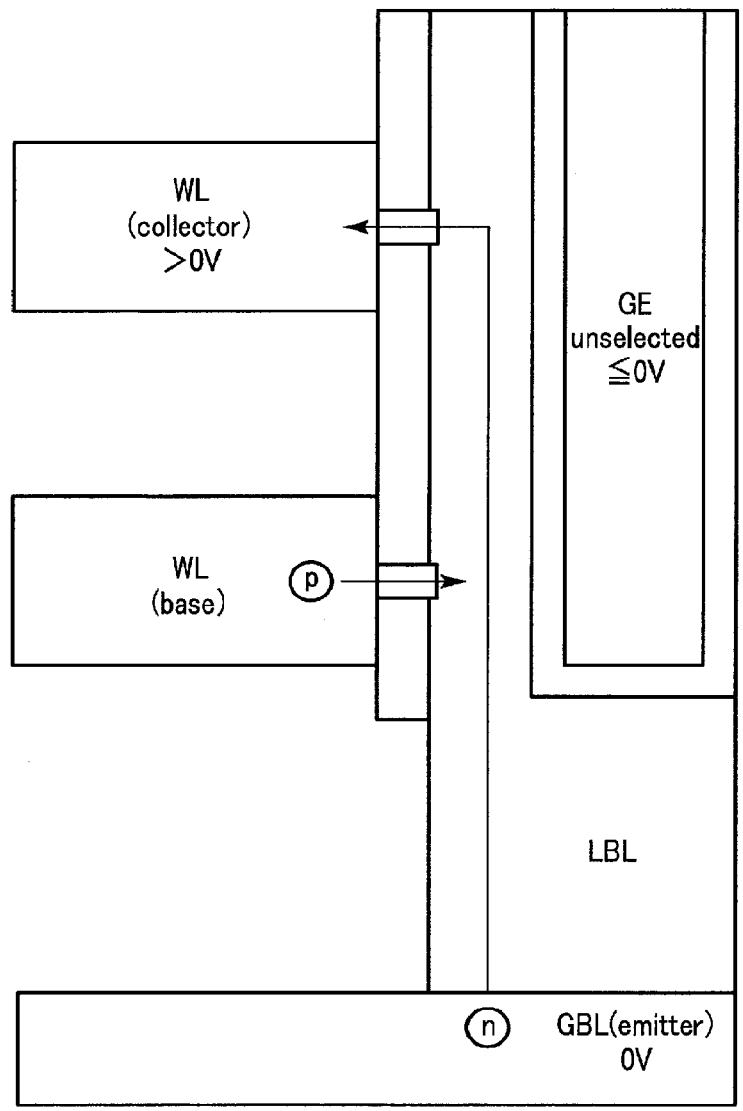
F I G. 7

SEMICONDUCTOR MEMORY DEVICE HAVING LOCAL BIT LINE WITH INSULATION LAYER FORMED THEREIN

FIELD

Embodiments described herein relate generally to a semiconductor memory device.

BACKGROUND

In recent years, with an increase in integration density of a semiconductor memory device, miniaturization of an LSI element has been advancing. For the miniaturization of the LSI element, not only the reduction in line width, but also the enhancement in dimensional precision and positional precision of circuit patterns is required. As a technique for addressing such challenges, a ReRAM (Resistive Random Access Memory) of a three-dimensional configuration has been proposed. The ReRAM is a resistance change type memory, and a variable resistance element, which reversibly changes a resistance value, is utilized as a memory. In addition, in the ReRAM of the three-dimensional configuration, a plurality of word lines extend in parallel to a substrate and are stacked in multiple layers. Moreover, local bit lines extend perpendicular to the substrate. Variable resistance elements are disposed between the word lines and local bit lines, and thereby it becomes possible to increase the integration density of memory cells.

BRIEF DESCRIPTION OF THE DRAWINGS

FIG. 1 is a block diagram illustrating a configuration example of a semiconductor memory device according to a first embodiment;

FIG. 3 is a perspective view illustrating the configuration of the memory cell array in the first embodiment;

FIG. 5 is a cross-sectional view illustrating the memory cell array in the first embodiment, as viewed from a Y direction, FIG. 5 illustrating the local bit line in greater detail;

FIG. 6 is a cross-sectional view illustrating a memory cell array in a second embodiment, as viewed from the Y direction, FIG. 6 illustrating a local bit line in greater detail; and FIG. 7 is a cross-sectional view illustrating a memory cell array in a comparative example, as viewed from the Y direction.

DETAILED DESCRIPTION

Figure 2:
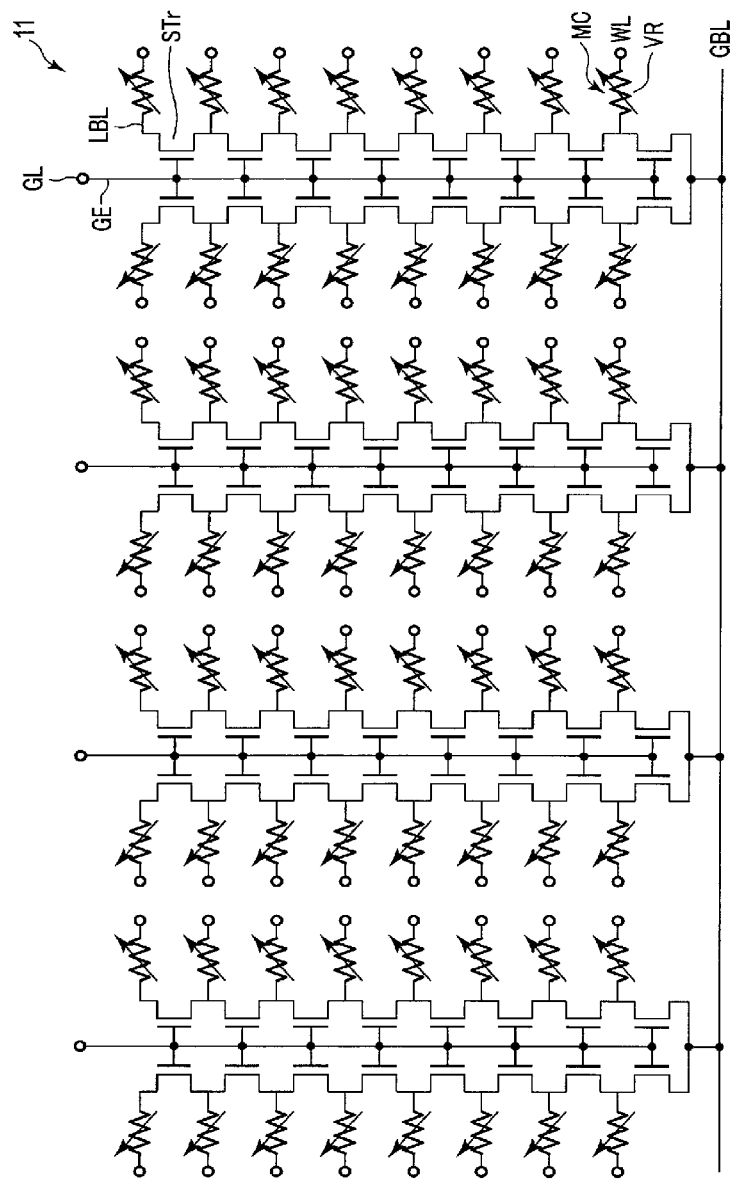
FIG. 2 is a circuit diagram illustrating the configuration of a memory cell array in the first embodiment.

In general, according to one embodiment, a semiconductor memory device includes first conductive layers extending in a first direction and stacked in a second direction intersecting the first direction, a first semiconductor layer extending in the second direction and including a material having one of a first conductivity type and a second conductivity type, a first insulation layer disposed inside the first semiconductor layer, a second conductive layer disposed inside the first insulation layer, and a variable resistance layer disposed between the first conductive layers and the first semiconductor layer.

Various embodiments will be described hereinafter with reference to the accompanying drawings. In the drawings, the same parts are denoted by like reference numerals.

First Embodiment

Referring to FIG. 1 to FIG. 5, a semiconductor memory device (resistance change type memory) according to a first embodiment is described.

Configuration Example in the First Embodiment

A configuration example of the semiconductor memory device according to the first embodiment is described with reference to FIG. 1 to FIG. 5. Here, a ReRAM is described as an example of the resistance change type memory.

FIG. 1 is a block diagram illustrating a configuration example of the semiconductor memory device according to the first embodiment.

As illustrated in FIG. 1, the semiconductor memory device includes a memory cell array 11, a row decoder 12, a column decoder 13, an upper block 14, a power supply 15, and a control circuit 16.

The memory cell array 11 includes a plurality of word lines WL, a plurality of local bit lines LBL, a plurality of memory cells MC, a gate line GL, and a global bit line GBL. The word lines WL and local bit lines LBL cross each other. The memory cells MC are disposed at intersections between the word lines WL and local bit lines LBL. The local bit lines LBL are selected by the application of a voltage from the gate line GL. The local bit lines LBL are electrically connected to the global bit line GBL.

At a time of access (data erase/write/read), the row decoder 12 selects the word line WL and local bit line LBL. At a time of access, the column decoder 13 selects the global bit line GBL.

The upper block 14 selects a memory cell MC, which is an access target, in the memory cell array 11. The upper block 14 delivers a row address to the row decoder 12, and delivers a column address to the column decoder 13.

The power supply 15 generates a combination of predetermined voltages which correspond to each of operations of data erase/write/read, and supplies the voltages to the row decoder 12 and column decoder 13.

The control circuit 16 controls the upper block 14 and power supply 15 in accordance with a command from the outside.

FIG. 2 is a circuit diagram illustrating the configuration of the memory cell array 11 in the first embodiment.

As illustrated in FIG. 2, in the memory cell array 11, memory cells MC are disposed at intersections between a plurality of word lines WL and a plurality of local bit lines LBL. The local bit lines LBL are electrically connected to a global bit line GBL shown in a lower part of FIG. 2. In the meantime, the semiconductor memory device of the first embodiment is configured such that a plurality of the structures illustrated in FIG. 2 are disposed in a horizontal direction to the sheet surface of FIG. 2 and in a vertical direction to the sheet surface of FIG. 2.

The memory cell MC includes a variable resistance element VR. The variable resistance element VR is electrically rewritable, and volatilely stores data, based on a resistance value. The variable resistance element VR changes from a high resistance state (reset state) to a low resistance state (set state) by a set operation. In addition, the variable resistance element VR changes from the low resistance state (set state) to the high resistance state (reset state) by a reset operation. In the set operation and reset operation, a voltage of a predetermined level or more is applied to both ends of the variable resistance element VR.

In addition, immediately after fabrication, the variable resistance element VR is in the state in which the resistance state is not easily changed, and is in the high resistance state. In this state, a forming operation is executed on the variable resistance element VR. In the forming operation, a high voltage, which is higher than voltages of the set operation and reset operation, is applied to both ends of the variable resistance element VR. By this forming operation, a region (filament path) in which current flows easily is locally formed in the variable resistance element VR. Thereby, the resistance state of the variable resistance element VR can be easily changed, and the variable resistance element VR transitions to a state in which the variable resistance element VR can operate as a memory element.

When a memory cell MC is selected and accessed, the local bit line LBL, which is connected to the memory cell MC, is selected by the column decoder 13. Specifically, a predetermined voltage is applied to the gate line GL which corresponds to the local bit line LBL that is to be selected. At the same time, a voltage of a value, which is different from the value of the voltage applied to the gate line GL, is applied to the global bit line GBL which corresponds to the selected memory cell MC. Then, an inversion layer occurs in the local bit line LBL by a potential difference between the gate electrode GE, which is electrically connected to the gate line GL, and the global bit line GBL. Thereby, a channel (current path) is formed in the local bit line LBL. Specifically, the gate electrode GE, local bit line LBL, and a gate insulation film (to be described later; not shown in FIG. 2) which is disposed therebetween, constitute a select transistor STr which includes the gate electrode GE as a gate, and the local bit line LBL as a channel.

A plurality of select transistors STr are connected in series in one local bit line LBL. In addition, by the application of a predetermined select voltage to the word line WL which is connected to the selected memory cell MC, an electric current flows by a potential difference between this word line WL and global bit line GBL, and the memory cell MC can be accessed. Besides, no current flows through an unselected memory MC cell, by an unselect voltage, which is less than the select voltage, being applied to the word line WL which is connected to the unselected memory cell MC.

Figure 4A:
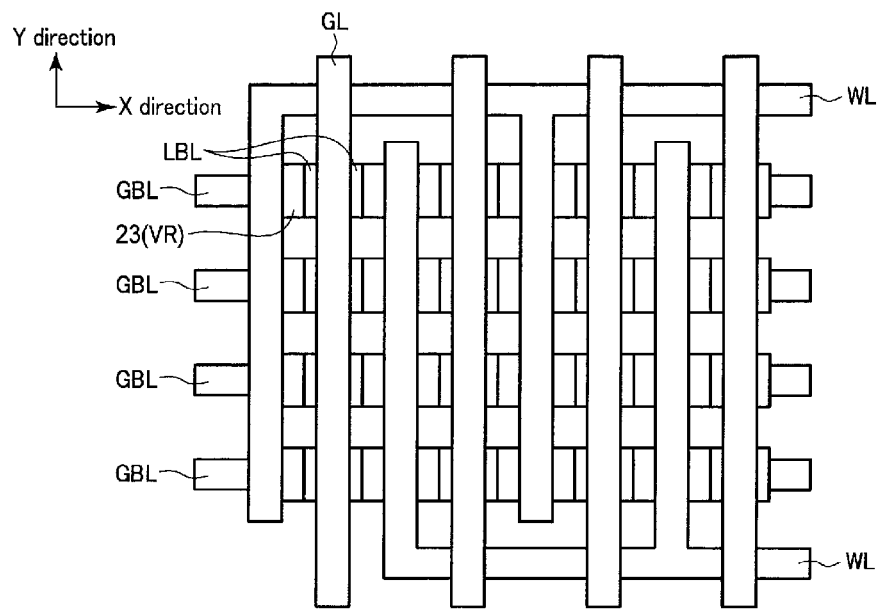
FIG. 4A is a plan view illustrating the memory cell array of FIG. 3, as viewed from a Z direction, FIG. 4A mainly illustrating gate lines and word lines.
Figure 4B:
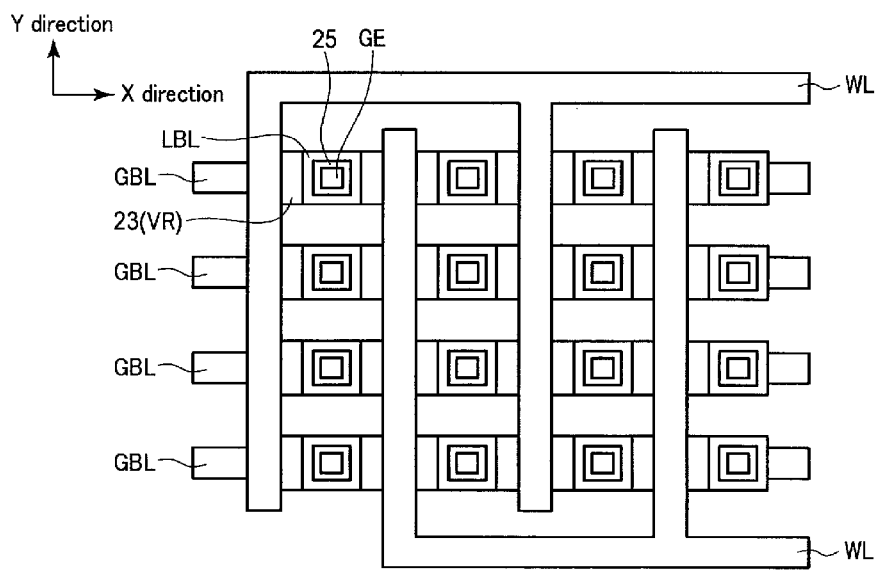
FIG. 4B is a plan view illustrating the memory cell array of FIG. 3, as viewed from the Z direction, FIG. 4B mainly illustrating local bit lines and word lines.

FIG. 3 is a perspective view illustrating the configuration of the memory cell array 11 in the first embodiment. FIG. 4A is a plan view illustrating the memory cell array 11 of FIG. 3, as viewed from a Z direction, FIG. 4A mainly illustrating gate lines GL and word lines WL. FIG. 4B is a plan view illustrating the memory cell array 11 of FIG. 3, as viewed from the Z direction, FIG. 4B mainly illustrating local bit lines LBL and word lines WL.

Incidentally, in FIG. 3, FIG. 4B and FIG. 4B, only layers, which are necessary for a memory function and an access function, are depicted, and the depiction of interlayer insulation layers 22 (to be described later) is omitted.

As illustrated in FIG. 3, a plurality of global bit lines GBL are disposed above a substrate 20. The global bit lines GBL extend in an X direction which is parallel to the substrate 20, and are arranged (spaced apart) with a predetermined pitch in a Y direction that is perpendicular to the X direction.

A plurality of word lines WL are disposed above the global bit lines GBL. The word lines WL are stacked (spaced apart) with a predetermined pitch in a Z direction that is perpendicular to the substrate 20. In addition, the word lines WL extend in the Y direction and are arranged (spaced apart) with a predetermined pitch in the X direction. Specifically, the word lines WL are arranged in a matrix, as viewed in the Y direction. Furthermore, as illustrated in FIG. 4A and FIG. 4B, the word lines WL have two sets of comb-teeth patterns, as viewed from the Z direction, and the teeth of the comb-teeth patterns are mutually opposed in an interlaced fashion.

A plurality of local bit lines LBL are disposed on the global bit lines GBL, and are electrically connected to the global bit lines GBL. Each of the local bit lines LBL has a pillar shape extending in the Z direction. The local bit lines LBL are arranged in a matrix, as viewed in the Z direction. The local bit lines LBL are disposed between the word lines WL which are arranged spaced apart in the X direction.

Variable resistance films 23 (variable resistance elements VR) are disposed at intersections between the local bit lines LBL and the word lines WL. Specifically, the variable resistance films 23 are disposed on both side surfaces of the local bit line LBL in the X direction.

Gate insulation layers 25 are disposed inside the local bit lines LBL. In addition, gate electrodes GE are disposed inside the gate insulation films 25. Gate lines GL are disposed on the gate electrodes GE, and these are electrically connected. The gate lines GL extend in the Y direction, and are arranged (spaced apart) with a predetermined pitch in the X direction. A plurality of select transistors STr, which are connected in series, are constituted by the local bit line LBL, gate insulation layer 25 and gate electrode GE.

With the provision of the above-described configuration, the memory cells MC each including the variable resistance element VR are disposed at intersections where the word lines WL and local bit lines LBL intersect. Accordingly, the memory cells MC have a three-dimensional matrix configuration in which the memory cells MC are disposed in the X, Y and Z directions. In the meantime, as illustrated in FIG. 4A and FIG. 4B, the plan-view shape of the local bit line LBL is a rectangular shape. As regards the relationship between the length in the X direction and the length in the Y direction of this rectangular shape, either the length in the X direction or the length in the Y direction may be greater than the other, or both lengths may be equal. In addition, the plan-view shape of the local bit line LBL is not limited to the rectangular shape, and may be a circular shape or an elliptic shape.

FIG. 5 is a cross-sectional view illustrating the memory cell array 11 in the first embodiment, as viewed from the Y direction, FIG. 5 illustrating the local bit line LBL in greater detail.

As illustrated in FIG. 5, interlayer insulation layers 22 and conductive layers 21 (word lines WL) are alternately stacked on a conductive layer 30 (global bit line GBL) on the substrate 20 (not shown in FIG. 5).

A columnar semiconductor layer 24 (local bit line LBL) is disposed on the conductive layer 30, and is disposed between the conductive layers 21 which are arranged in the X direction and between the interlayer insulation layers 22 which are arranged in the X direction. The semiconductor layer 24 is, at a lower end thereof, put in contact with the conductive layer 30. The semiconductor layer 24 has a U shape, as viewed from the Y direction.

The gate insulation layer 25 is disposed inside the semiconductor layer 24. In other words, the periphery (side surfaces and bottom surface) of the gate insulation layer 25 is covered with the semiconductor layer 24. The gate insulation layer 25 has a U shape in a cross section in the X direction and Z direction. The conductive layer 26 (gate electrode GE) is disposed inside the gate insulation layer 25. In other words, the periphery of the conductive layer 26 is covered with the gate insulation layer 25. When an electric field is applied by the conductive layer 26, the semiconductor layer 24 forms a channel near an interface with the gate insulation layer 25. Thereby, the select transistor STr shown in FIG. 2 is switched to an electrically conductive state.

The variable resistance film 23 is disposed between the semiconductor layer 24 and conductive layer 21 and between the semiconductor layer 24 and interlayer insulation layer 22. In other words, both side surfaces in the X direction of the semiconductor layer 24 are covered with the variable resistance films 23. In the meantime, it should suffice if the lower end of the variable resistance film 23 is positioned lower than the lower end of the lowermost conductive layer 21, and the lower end of the variable resistance film 23 may be put in contact with the global bit line GBL. In addition, in FIG. 5, although the variable resistance film 23 is disposed commonly over a plurality of word lines WL, the variable resistance film 23 may be configured such that the variable resistance film 23 is dividedly disposed in association with each word line WL.

The conductive layer 30 (global bit line GBL) is formed of, for example, polysilicon in which an impurity is added, tungsten (W), titanium (Ti), tungsten nitride (WN), or titanium nitride (TiN).

The conductive layer 21 (word line WL) is formed of an elementary substance of a transition metal as an electrically conductive material, or a nitride thereof. For example, the word line WL may be formed of Ti, TiN, W, WN, tungsten silicide (WSix), tantalum (Ta), tantalum nitride (TaN), tantalum silicide (TaSix), palladium silicide (PdSix), erbium silicide (ErSix), yttrium silicide (YSix), platinum silicide (PtSix), hafnium silicide (HfSix), nickel silicide (NiSix), cobalt silicide (CoSix), titanium silicide (TiSix), vanadium silicide (VSix), chromium silicide (CrSix), manganese silicide (MnSix), iron silicide (FeSix), ruthenium (Ru), molybdenum (Mo), vanadium (V), chromium (Cr), manganese (Mn), iron (Fe), cobalt (Co), nickel (Ni), gold (Au), silver (Ag), or copper (Cu), or a compound thereof. In addition, the word line may be formed of polysilicon doped with impurities.

The variable resistance film 23 is formed of a metal oxide film of, for example, hafnium oxide (HfOx), etc. The thickness of this metal oxide film is, for example, about 5 nm, but may be properly variable in a range of about 2 to 10 nm. Other than HfOx, use may be made of a transition metal oxide of Cr, W, V, niobium (Nb), Ta, Ti, zirconium (Zr), scandium (Sc), yttrium (Y), thorium (Th), Mn, Fe, Ru, osmium (Os), Co, Ni, Cu, zinc (Zn), cadmium (Cd), aluminum (Al), gallium (Ga), indium (In), tin (Sn), lead (Pb), or bismuth (Bi), or any one of oxides of so-called rare earth elements ranging from lanthanum (La) to lutetium (Lu).

The semiconductor layer 24 is formed of a semiconductor material including electrons or holes as majority carriers (a semiconductor material having an electric charge of a single conductivity type as carriers). As shown in E. Fortunato et al., Adv. Mater. 2012, 24, 2945-2986, an example of the semiconductor material including electrons as majority carriers is oxide semiconductor including one of indium (In), gallium (Ga) zinc (Zn), and zirconium (Zr). For example, the semiconductor material including electrons as majority carriers includes indium gallium zinc oxide (InGaZnO). As shown in E. Fortunato et al., Adv. Mater. 2012, 24, 2945-2986, an example of the semiconductor material including holes as majority carriers is copper oxide ($Cu_2O$) or tin oxide (SnO). In addition, an example of the semiconductor material including holes as majority carriers is an organic semiconductor except an inorganic compound, which is, for instance, pentacene. Whether the semiconductor layer 24 is to be formed of a material including electrons as majority carriers or a material including holes as majority carriers is determined by the ease in change of resistance when a voltage is applied to the material of the variable resistance film 23 from the word line WL and local bit line LBL. To be more specific, the ease in change of resistance is determined, for example, based on the smallness of voltages/currents necessary for forming, set and reset, and the smallness of energies necessary for forming, set and reset. Here, the phrase "having an electric charge of a single conductivity type as carriers" indicates that an electric current is caused to flow by substantially only majority carriers, and indicates that, for example, the mobility (diffusion coefficient) of minority carriers is $1/10$ or less of the mobility of majority carriers.

The gate electrode GE is formed of polysilicon in which a high-concentration impurity is added, or TiN. The gate insulation layer 25 is formed of $SiO_2$ or alumina.

Advantageous Effects of the First Embodiment

As illustrated in FIG. 7, in a ReRAM of a three-dimensional configuration in a comparative example, a local bit line LBL is formed of a semiconductor layer of polysilicon or the like, and serves as a channel of a select transistor. By properly applying a voltage to a select gate electrode GE belonging to the local bit line LBL, this local bit line LBL is electrically connected to the global bit line GBL (the local bit line is selected), or is not electrically connected (the local bit line is not selected). However, even if a negative voltage is applied to the select gate electrode GE in order to set the local bit line LBL in the unselected state, the channel current of the select transistor (the current flowing in the local bit line LBL) does not completely become 0 A. Typically, a leak current on the order of 1 pA to 10 nA may flow. There is a case in which minority carriers are injected in this local bit line LBL from an arbitrary electrode (word line WL (base)) via a filament. In this case, even if the local bit line LBL is in the unselected state, a leak current is amplified by a parasitic effect of a bipolar action. Specifically, two word lines WL become a collector and a base in a pseudo-manner, respectively, and the global bit line GEL becomes an emitter. In addition, if minority carriers are accumulated in the local bit line by impact ionization, the channel potential rises or falls (floating-body effect). Thereby, the reliability in various operations, such as forming, set and rest, deteriorate.

As described above, in the local bit line of the ReRAM of the three-dimensional configuration, the occurrence of minority carriers leads to various problems. When various operations of the ReRAM are executed mainly by an electron current, holes that are minority carriers are needless. Conversely, when various operations of the ReRAM are executed mainly by a hole current, electrons that are minority carriers are needless. If this requirement is explained with respect to the ReRAM of the electron current operation, it is required that the local bit line should not originally include minority carriers (n>>p), or, even if minority carriers are injected from the word line WL, the mobility (diffusion coefficient) should be small ($\mu n \gg \mu p$, $Dn \gg Dp$). Furthermore, it is required that the minority carrier life of the local bit line be short, so that minority carriers may immediately disappear on the order of a shorter time than the time scale of various operations ($\tau p < \tau operation$).

By contrast, according to the first embodiment, in the ReRAM of the three-dimensional configuration, the pillar local bit line LBL, which serves as a channel of the select transistor STr, is formed of the semiconductor material having an electric charge of a single conductivity type as carriers. Specifically, the local bit line LBL has a conductivity of substantially only majority carriers. Thereby, no minority carriers are injected in the local bit line LBL, or, otherwise, even if minority carries are injected, the minority carries will immediately disappear (the life is short). Therefore, it is possible to suppress the problem (bipolar action and channel floating effect) due to accumulation of minority carriers in the local bit line LBL.

In the meantime, in the present embodiment, the ReRAM has been described as an example of the resistance change type memory, but the resistance change type memory is not limited to the ReRAM. For example, the resistance change type memory may be a PC (Phase Change) RAM, or a CB (Conductive Bridging) RAM. The PCRAM includes a chalcogenide element, and causes a resistance value to change by a phase transition between a crystalline state and an amorphous state. The CBRAM includes a solid electrolyte, and causes a resistance value to change by precipitating metal cations and forming a conducting bridge between electrodes, or by breaking a conducting bridge by ionizing a precipitated metal.

Second Embodiment

Next, referring to FIG. 6, a semiconductor memory device according to a second embodiment is described. Incidentally, in the second embodiment, a description of the same points as in the first embodiment is omitted, and different points will mainly be described.

Configuration Example in the Second Embodiment

A configuration example of the semiconductor memory device according to the second embodiment is described with reference to FIG. 6.

FIG. 6 is a cross-sectional view illustrating a memory cell array 11 in the second embodiment, as viewed from the Y direction, FIG. 6 illustrating a local bit line LBL in greater detail.

As illustrated in FIG. 6, the second embodiment differs from the first embodiment in that a semiconductor layer 40 is disposed as a lower end portion of the local bit line LBL.

The semiconductor layer 40 having a pillar shape is disposed on the conductive layer 30, and is disposed between lowermost interlayer insulation layers 22 which are arranged in the X direction. Specifically, the semiconductor layer 40 is disposed between the conductive layer 30 and semiconductor layer 24, and is, at a lower end thereof, put in contact with the conductive layer 30. The semiconductor layer 40 is formed of a semiconductor having a smaller energy gap than the semiconductor layer 24, for example, a semiconductor such as polysilicon. As described above, the semiconductor layer 24 is formed of a semiconductor material including electrons or holes as majority carriers, and, in general, such a material has a large energy gap. When the conductive layer 30 is formed of a metallic material, if the conductive layer 30 is directly connected to the semiconductor layer 24 with the large energy gap, the interface between the semiconductor layer 24 and conductive layer 30 tends to easily become a Schottky junction having a great barrier. Thus, a large contact resistance may occur at the interface. On the other hand, the interface between the semiconductor (semiconductor layer 40) with a small energy gap and the conductive layer 30 does not become a Schottky junction having a great barrier. In addition, in order to more efficiently lower the contact resistance between the semiconductor layer 40 and conductive layer 30, it is preferable that the semiconductor layer 40 not merely has a small energy gap, but is also doped with impurities such as phosphorus (P), boron (B) or arsenic (As). If the semiconductor layer 40 is doped with impurities in this manner, the semiconductor layer 40 has electrons or holes as majority carriers, depending on whether the impurities are donors or acceptors, or depending on the concentration of the impurities. The semiconductor layer 40 and semiconductor layer 24 are configured such that the majority carriers of the semiconductor layer 40 agree with the majority carriers of the semiconductor layer 24.

An upper end of the semiconductor layer 40 is lower than a lower end of the lowermost conductive layer 21 and a lower end of the conductive layer 26 (gate electrode GE). This aims at preventing the semiconductor layer 40 from being included in any one of the select transistors STr illustrated in FIG. 2. If the select transistor STr is composed by the semiconductor layer 40 with a small energy gap, electron-hole pairs tend to easily occur due to impact ionization in this select transistor STr. The reason for this is that a semiconductor having a smaller energy gap will generate electron-hole pairs by a lower energy threshold than a semiconductor having a larger energy gap. Minority carriers generated by impact ionization may become a cause of the channel floating effect as described above.

The pillar semiconductor layer 24 is disposed on the semiconductor layer 40, and is disposed between the conductive layers 21 which are arranged in the X direction and between the interlayer insulation layers 22 which are arranged in the X direction. The semiconductor layer 24 is, at a lower end thereof, put in contact with the semiconductor layer 40. The semiconductor layer 24 has a U shape, as viewed from the Y direction.

Advantageous Effects of the Second Embodiment

According to the second embodiment, the semiconductor layer 40 is disposed as the lower end portion of the local bit line LBL. The contact resistance between the conductive layer 30 and semiconductor layer 40 can be made lower than the contact resistance between the conductive layer 30 and semiconductor layer 24. Thus, a signal current level increases, and the electrical characteristics can be improved. In addition, the select transistor STr does not include the semiconductor layer 40 with a small energy gap, but includes only the semiconductor layer 24 with a large energy gap. Thus, in the select transistor STr, the resistance to generation of electron-hole pairs due to impact ionization becomes higher. Specifically, by enhancing the reliability against the channel floating effect, the electrical characteristics can be improved.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   first conductive layers extending in a first direction and stacked in a second direction intersecting the first direction;
   a first semiconductor layer, extending in the second direction and including a material having one of a first conductivity type and a second conductivity type;
   a first insulation layer disposed inside the first semiconductor layer;
   a second conductive layer disposed inside the first insulation layer;
   a variable resistance layer disposed between the first conductive layers and the first semiconductor layer;
   a second semiconductor layer which is in contact with a lower end of the first semiconductor layer; and
   a third conductive layer which is in contact with a lower end of the second semiconductor layer, and extends in a third direction intersecting the first direction and the second direction.

2. The device of claim 1, wherein the first semiconductor layer includes oxide semiconductor.

3. The device of claim 2, wherein the first semiconductor layer includes one of In, Ga, and Zn.

4. The device of claim 2, wherein the first semiconductor layer includes one of Cu and Sn.

5. The device of claim 1, wherein the first semiconductor layer includes an organic semiconductor.

6. The device of claim 1, wherein an energy gap of the second semiconductor layer is smaller than an energy gap of the first semiconductor layer.

7. The device of claim 1, wherein a contact resistance between the second semiconductor layer and the third conductive layer is lower than a contact resistance between the first semiconductor layer and the third conductive layer.

8. The device of claim 1, wherein the second semiconductor layer includes polysilicon.

9. The device of claim 1, wherein the variable resistance layer includes a metal oxide.

10. The device of claim 1, wherein the variable resistance layer includes a chalcogenide element.

11. The device of claim 1, wherein the variable resistance layer includes a solid electrolyte.

12. A semiconductor memory device comprising:
    first conductive layers extending in a first direction and stacked in a second direction intersecting the first direction;
    a first semiconductor layer, extending in the second direction and including a material having one of a first conductivity type and a second conductivity type;
    a first insulation layer disposed inside the first semiconductor layer;
    a second conductive layer disposed inside the first insulation layer; and
    a variable resistance layer disposed between the first conductive layers and the first semiconductor layer;
    wherein the first semiconductor layer, the first insulation layer, and the second conductive layer constitute a transistor.

* * * * *